(12) United States Patent
Maroldt

(10) Patent No.: US 9,716,473 B2
(45) Date of Patent: Jul. 25, 2017

(54) AMPLIFIER CIRCUIT

(71) Applicant: Fraunhofer-Gesellschaft zur Förderung der angewandten Forschung E.V., Munich (DE)

(72) Inventor: Stephan Maroldt, Freiburg (DE)

(73) Assignee: Fraunhofer-Gesellschaft zur Förderung der angewandten Forschung E.V., München (DE)

( * ) Notice: Subject to any disclaimer, the term of this patent is extended or adjusted under 35 U.S.C. 154(b) by 0 days.

(21) Appl. No.: 14/550,155

(22) Filed: Nov. 21, 2014

(65) Prior Publication Data
US 2015/0145598 A1 May 28, 2015

(30) Foreign Application Priority Data

Nov. 22, 2013 (DE) .................. 10 2013 223 898

(51) Int. Cl.
| | |
|---|---|
| *H03F 3/14* | (2006.01) |
| *H03F 1/22* | (2006.01) |
| *H03F 3/195* | (2006.01) |
| *H03F 3/21* | (2006.01) |
| *H03F 3/24* | (2006.01) |

(52) U.S. Cl.
CPC ............. *H03F 1/223* (2013.01); *H03F 3/195* (2013.01); *H03F 3/211* (2013.01); *H03F 3/245* (2013.01)

(58) Field of Classification Search
CPC ...................................................... H03F 1/223
USPC ................................. 330/302–307, 277, 284
See application file for complete search history.

(56) References Cited

U.S. PATENT DOCUMENTS

| | | | | |
|---|---|---|---|---|
| 4,588,962 | A * | 5/1986 | Saito | .......................... H01P 5/12 330/286 |
| 5,502,421 | A * | 3/1996 | Nakahara | ............. H03H 11/245 327/308 |
| 6,556,085 | B2 * | 4/2003 | Kwon | ..................... H03F 1/223 330/285 |
| 7,199,667 | B2 | 4/2007 | Donig et al. | |

FOREIGN PATENT DOCUMENTS

| | | |
|---|---|---|
| DE | 2231931 A1 | 2/1973 |
| DE | 10345498 A1 | 5/2005 |
| GB | 1399899 | 7/1975 |

* cited by examiner

*Primary Examiner* — Khanh V. Nguyen
*Assistant Examiner* — Khiem Nguyen
(74) *Attorney, Agent, or Firm* — Volpe and Koenig, P.C.

(57) ABSTRACT

An amplifier circuit with at least one basic transistor, at least one load transistor, and at least one impedance element, the basic transistor being connected to the impedance element and the load transistor, an amplifier input and output, the amplifier input being connected to the gate contact of the basic transistor and the amplifier output being connected to a source contact of the load transistor. Here the amplifier circuit has at least two combined amplifying cells, with each combined amplifying cell respectively including a basic transistor, a load transistor, and an impedance element, with the basic transistor and the load transistor being non-complementary single-pin transistors, and arranged cooperating with the impedance element, and every combined amplifying cell has an input and an output, which cell input being connected to a gate contact of the basic transistor and which cell output being connected to a contact of the impedance element.

20 Claims, 6 Drawing Sheets

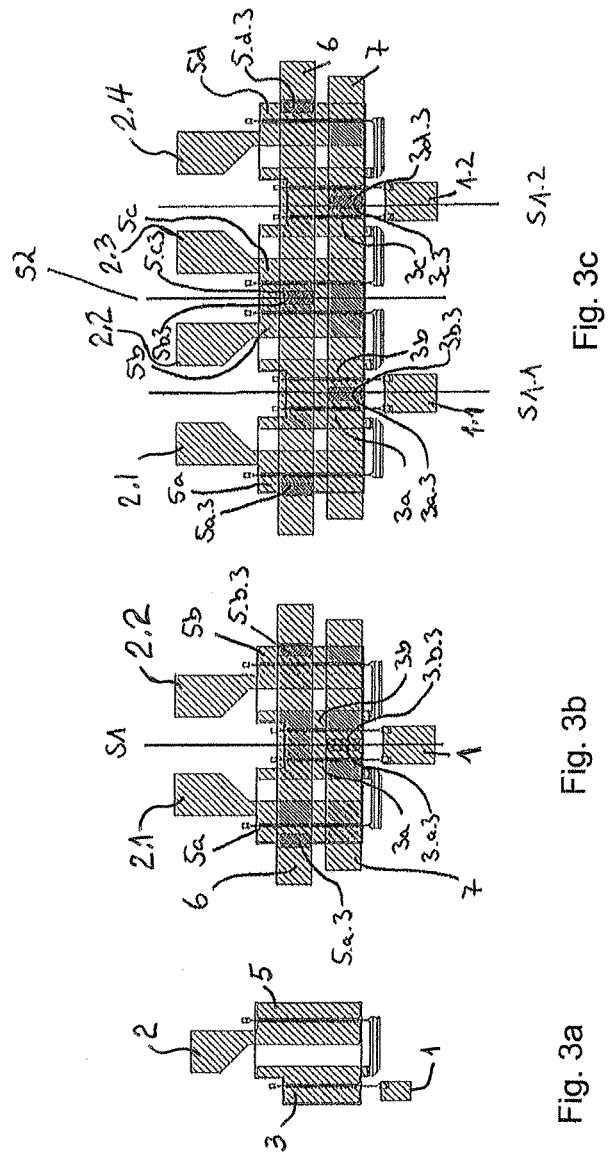

AMPLIFIER CIRCUIT

INCORPORATION BY REFERENCE

The following documents are incorporated herein by reference as if fully set forth: German Patent Application No. 10 2013 223 898.3, filed Nov. 22, 2013.

BACKGROUND

The invention relates to an amplifier circuit with a basic transistor and a load transistor.

Such an amplifier circuit comprises at least one basic transistor, at least one load transistor, and at least one impedance element. The basic transistor is connected to the impedance element and the load transistor. Further, the amplifier circuit comprises an amplifier input and an amplifier output, with the amplifier input being connected to the gate contact to the basic transistor and the amplifier output being connected to a contact of the impedance element.

In many technical applications it is necessary to achieve high energy efficiencies for power amplifiers in the microwave frequency range. Typically this range of applications demands a square wave-input voltage for optimal efficiency.

Passive harmonic matching amplifiers as well as active driver amplifier circuits are know from prior art.

In the amplifier circuits according to prior art it is disadvantageous that passive harmonic matching amplifiers operate only in a narrow frequency band and active driver amplification circuits can only be used in a low power range.

Switch-mode power amplifiers are also known from prior art. They show an inverter driver stage and a power transistor. When GaN-semiconductor transistors or transistors of the group of the III-V-semiconductors of prior art are used, these transistors are typically formed as non-complementary transistors.

Inverter driver stages are typically realized via complementary Si-based semiconductor technology, while power transistors are typically realized via non-complementary GaN-based semiconductor technology. Here it is disadvantageous that these two semiconductor technologies cannot be realized on a single chip. It is therefore necessary to connect the driver stage and the power transistor stage via bond-wire technology. This leads to power loss, parasitic effects, and distortions of the square wave. Previous approaches known from prior art suggest the use of integrated CMOS-inverters on a Si-basis. These amplifier circuits are however optimized for the operation at voltages ranging at one Volt, while the GaN-based power transistors require a voltage ranging at 5 V.

In these concepts of prior art it is further disadvantageous that the scaling towards higher output power requires a large area on the chip and thus it is costly.

SUMMARY

The present invention is therefore based on the objective to suggest an amplifier circuit with a compact layout, which can be scaled and parallelized and which can be realized with non-complementary transistors.

This objective is attained in an amplifier circuit with one or more features of the invention. Preferred embodiments of the amplifier circuit according to the invention are disclosed below and in the claims, the wording of which is explicitly included in the description by way of reference.

The amplifier circuit according to the invention comprises as known per se at least one basic transistor, at least one load transistor, and at least one impedance element, with the basic transistor being connected to the impedance element and the load transistor. Further, the amplifier circuit comprises an amplifier input and an amplifier output, with the amplifier input being connected to the gate-contact of the basic transistor and the amplifier output being connected to a contact of the impedance element.

It is essential that the amplifier circuit comprises at least two amplifier unit cells, with it applying for each of the two amplifier unit cells:

the amplifier unit cell comprises a basic transistor, a load transistor, and an impedance element;

the basic transistor and the load transistor are embodied as non-complementary single-pin transistors;

the basic transistor and the load transistor are embodied and arranged cooperating with the impedance element;

the amplifier unit cell comprises a cell input and a cell output, with the cell input being connected to the gate contact of the basic transistor and the cell output being connected to a contact of the impedance element, and that both amplifier unit cells are arranged on a common semiconductor substrate.

The amplifier circuit according to the invention differs therefore from amplifier circuits of prior art in essential aspects: The basic transistor and the load transistor are embodied as non-complementary single-pin transistors. One basic transistor each and one load transistor are embodied cooperating with an impedance element as a combined amplifying cell. Each amplifier unit cell can be switched parallel to an arbitrary number of identical amplifier unit cells. Contrary thereto, in amplifier circuits of prior art a multi-pin basic transistor is connected via a metal-resistor to a multi-pin load transistor and this way scalability is realized to higher output powers.

This way, the advantage particularly resulting is the fact that non-complementary transistor technologies can be used. Additional advantages are the facts that by the compact arrangement lower parasitic effects occur between the individual components of the amplifier circuit. This way the signal quality is improved, particularly the signal form of the square voltage. Furthermore, the reduction of the parasitic effects allows the operation at higher frequency ranges. By the ability of a parallel arrangement a simple and area-efficient scalability is yielded, which allows higher output powers.

Within the scope of this description the term "non-complementary single-pin transistor" relates to a smallest layout-capable and electrically operating transistor sub-cell.

In one preferred embodiment, at least two amplifier unit cells are arranged side-by-side, with an amplifier unit cell input of one amplifier unit cell is connected to an amplifier unit cell input of the other amplifier unit cell or an amplifier unit cell output of one amplifier unit cell is connected to an amplifier unit cell output of the other amplifier unit cell. This way, the advantage results that at least two amplifier unit cells are arranged on a semiconductor chip in a space-saving fashion such that both amplifier unit cells show a common input point or a common output point at a connection point of the two amplifier unit cells.

Within the scope of this description the statements relating to the arrangement of components in reference to each other concern the amplifier layout, i.e. the actual topographic embodiment of the amplifier circuit.

In another preferred embodiment the two amplifier unit cells are arranged mirror-symmetrical side-by-side. Preferably at least the basic transistors, load transistors, and impedance elements are arranged mirror-symmetrically with regards to a first axis of symmetry extending between the basic transistors or between the load transistors. This way, the advantage results that the amplifier input for both amplifier unit cells can be formed combined in a simple fashion. By the symmetric arrangement of at least two amplifier unit cells additionally a space-saving arrangement is yielded on the semiconductor chip.

In another preferred embodiment the basic transistors or the load transistors of the first axis of symmetry are arranged next to each other. Preferably the basic transistors or the load transistors are arranged directly abutting at the first axis of symmetry.

In another preferred embodiment, at least four amplifier unit cells are arranged located side-by-side. Preferably at least two pairs of symmetric amplifier unit cells are arranged located side-by-side, preferably in a mirror-symmetric fashion. Particularly preferred, at least two pairs of symmetric amplifier unit cells are arranged in a mirror-symmetric fashion with regards to a second axis of symmetry extending between at least two pairs of symmetric amplifier unit cells.

In another preferred embodiment the amplifier circuit comprises a common first bias line for all drain contacts of the load transistors and a common second bias line of the two source-contacts of the two basic transistors. This way, the advantage develops that the first and the second bias line can easily be integrated in the amplifier circuit in a space-saving fashion and can be arranged on the chip.

In another preferred embodiment the first bias line and the second bias line extend essentially parallel, particularly perpendicular in reference to a central axis of symmetry. This way a particularly space-saving and area-efficient layout of the amplifier circuit develops.

In another preferred embodiment the drain contact of the basic transistor is connected to the gate contact of the load transistor and the impedance element, and the source contact of the load transistor is connected to the impedance element and the cell output.

In another preferred embodiment the basic transistor is formed as a d-mode field effect transistor or a self-blocking e-mode field effect transistor, and the load transistor is embodied as a d-mode n-field effect transistor. Preferably the basic transistor is embodied as a n-channel field effect transistor or a p-channel field effect transistor and/or the load transistor is embodied as a n-channel field effect transistor or p-channel field effect transistor. This way the advantageous electric behavior for generating a square voltage can be achieved in a simple fashion.

In another preferred embodiment the impedance element comprises a parasitic capacitance, which is below the gate capacitance of the load transistor and the basic transistor. This way, advantageously a rapid switching of the load transistor can be achieved via the impedance element.

In another preferred embodiment the impedance element is formed as constant or variable impedance, preferably depending on voltage, current, or frequency. Preferably the impedance element has a first high differential resistance below a characteristic voltage (voltage threshold), with the differential resistance being at least twice, most preferably 10 times greater than an ideal ohmic resistance as the impedance element. Preferably the impedance element has a second low differential resistance above the characteristic voltage, with the differential resistance being at least twice, most preferably 10 times lower than an ideal ohmic resistance as the impedance element. Most preferably, below the characteristic voltage a defined current flux can be adjusted via the first high differential resistance.

Here, the scope of the invention includes that the impedance element comprises several components. Preferably the impedance element has a resistor, for example a metal resistor, or a semiconductor resistor and/or a diode, most preferably a diode and a field effect transistor. The impedance element may comprise as additional potential elements, for example field effect and/or bipolar transistors, as well as non-linear resistors and/or thyristors or tunnel diodes. Here it is advantageous that with the above-mentioned elements a high static resistance can be realized with low current in a simple and known fashion and with increasing current here still low resistance can be yielded during the switching process.

Specific electric features of the amplifier circuit result from the above-mentioned preferred embodiment, which shall be described in the following:

1. Static Features

At a high level of output voltage the basic transistor is in the blocked state. The impedance element switches the load transistor into the passing state and no static current is flowing. When the load transistor is embodied as a self-conducting n-FET, a low voltage drop develops over the impedance element, with its amount typically ranging from zero to 0.2× of the characteristic voltage.

When the level of the output voltage is low, the basic transistor is in the passing state. The impedance element switches the load transistor into the blocked state and thus here too no or only a low static current is flowing. When the load transistor is embodied as a self-conducting n-FET, a voltage drop develops over the impedance element in the range of the characteristic voltage and above. The value of the characteristic voltage is typically the amount of the voltage threshold of the load transistor, by which it is switched into the blocked state as described above.

2. Dynamic Features

During the transition from a low to a high output power the basic transistor is switched from the passing state to the blocked state. A current flows via the impedance element to the load transistor in order to rapidly switch the load transistor from the blocked state to the passing state.

At a transition of the level of the output voltage from a high level of the output voltage to a low level of the output voltage the basic transistor is switched from the blocked state to the passing state. The impedance element has a low resistance in the range of the resistance of the basic transistor in the passing state or below that. The voltage drop at the impedance element therefore switches the load transistor into the blocked state and thus an increased load drop develops at the load transistor.

For the example of an impedance element, which comprises a diode, it provides that the resistance becomes lower with increasing current. In the static case, here the problem arises that the resistance becomes excessive. Here, even in the static case it must be possible for a low current to flow in order to transform parasitic capacitances. By the additional arrangement of a field effect transistor in the impedance element, in addition to the diode, the behavior improves in the static case, by the field effect transistor allowing a low current flux.

In another preferred embodiment the amplifier circuit comprises at least one power transistor, which power transistor is arranged between the amplifier unit cells and the amplifier output and connected to at least one cell output. The amplifier unit cells form here a driver stage for the power transistor. The power transistor can therefore be supplied from the driver stage with the square wave voltage in an easy fashion and the parasitic effects between the driver stage and the power transistor are minimized. Preferably the amplifier unit cells and at least one power transistor are arranged on one chip or a common semiconductor substrate. This yields the advantage that amplifier unit cells and the power transistor can be formed in semiconductor technology. It is further advantageous that no connection is required via bond wires or the like, which have disadvantageous effects upon the frequency band width and which lead to a distortion of the square wave voltage.

The combination of the driver state with the amplifier unit cells and the power transistor allows the distribution of the digital signal at the input of the power transistor, so that operation can be yielded at higher frequency ranges.

In another preferred embodiment each amplifier unit cell is connected with its cell output to at least one power transistor. This yields the advantage that by the ability to parallelize the amplifier unit cells scalability is ensured of the signals transferred to the power transistor.

In another preferred embodiment the amplifier embodiment comprises at least two amplifier circuits, which leads to the advantage that by the scalability an increase of the output power is possible with consistent signal quality.

Advantageously the amplifier circuit allows a maximum driver voltage, which can be predetermined, in order to consider different maximal operating frequencies or different input capacities of the power transistor.

The amplifier circuit according to the invention and/or one of its embodiments are generally suitable for applications in which power amplifiers in the microwave frequency range (a few Gigahertz) must achieve energy efficiencies and a square wave-input voltage.

The amplifier circuit according to the invention is therefore preferably embodied for the use of GaN-based applications in base stations for mobile communication,
in highly efficient plasma lamps,
in small-scale microwave ovens,
in the field of automotive industry, such as for spark plugs,
as well as in digital signal generators with high output voltages and in the amplitude range of Gigabits per second.

BRIEF DESCRIPTION OF THE DRAWINGS

In the following, additional preferred features and embodiments of the amplifier circuit according to the invention are explained based on exemplary embodiments and the figures. Shown are:

FIG. 3 is a scalable combined cell in the details A through C, A) an amplifier unit cell, B) two amplifier unit cells, C) four amplifier unit cells;

DETAILED DESCRIPTION OF THE PREFERRED EMBODIMENTS

Figure 2:
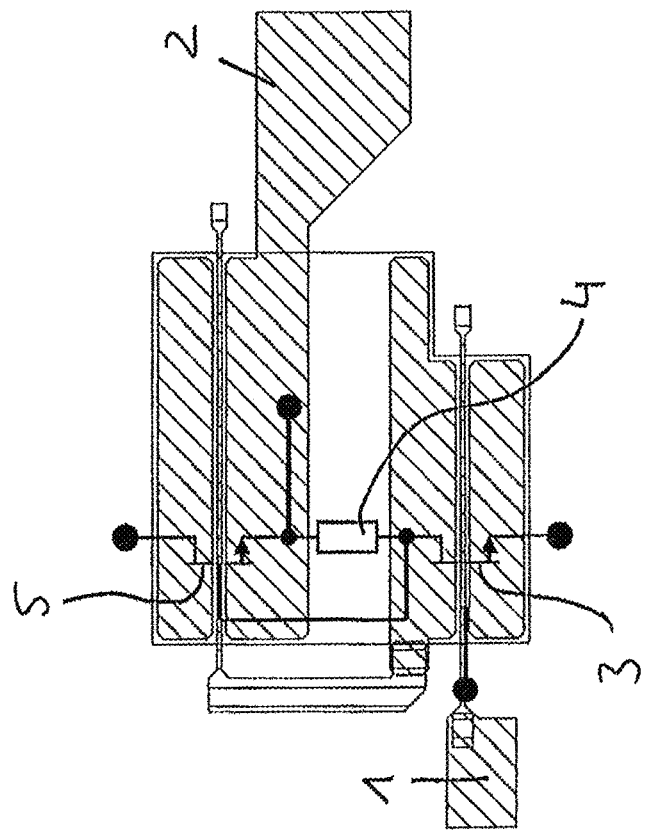
FIG. 2 is a first exemplary embodiment of an amplifier layout of an amplifier unit cell.

In FIGS. 1 to 6 identical reference characters relate to similar elements or those showing the same effects.

Figure 1:
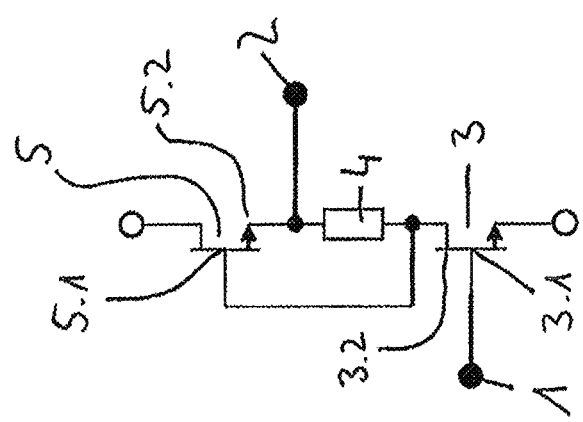
FIG. 1 is a schematic illustration of an amplifier unit cell of an amplifier circuit according to the invention.

FIG. 1 shows the schematic illustration of an amplifier unit circuit according to the invention with a cell input 1 and a cell output 2. The amplifier unit cell represents GaN-semiconductor transistors or transistors of the group of the III-V-semiconductors.

The amplifier unit cell comprises a basic transistor 3, a load transistor 5, and an impedance element 4. The cell input 1 is connected to the gate contact 3.1 of the basic transistor 3. The drain contact 3.2 of the basic transistor 3 is connected to the impedance element 4 and the gate contact 5.1 of the load transistor 5. The source contact 5.2 of the load transistor 5 is in turn connected to the impedance element 4 and the cell output 2.

The basic transistor 3 and the load transistor 5 are embodied as non-complementary single-pin transistors, in the present case as self-conducting transistors. However, the scope of the invention also includes that the transistor 3 or 5 are embodied as self-blocking transistors. The basic transistor 3 and the load transistor 5 are preferably embodied as transistors of the group of the III-V-semiconductors, in the present case as GaN-based transistors.

In the present case, the impedance element 4 is embodied as a diode in combination with a field effect transistor, and shows a low parasitic capacity, i.e. lower than the gate capacity of the load transistor 5 and the basic transistor 4.

FIG. 2 shows a first exemplary embodiment of an amplifier layout of an amplifier unit cell of an amplifier circuit according to the invention, with a schematic illustration of an amplifier unit cell being superimposed.

In the following tables, typical dimensions of the transistors used (for FETs) of a combined amplifying cell are listed:

|  | Gate length | Pin - gate width | Number of pins | Total gate width |
|---|---|---|---|---|
| Basic transistor | 0.01-1 μm | 100 μm | 2-20 | 0.05-1 mm |
| Load transistor | 0.01-1 μm | 100 μm | 2-20 | 0.05-1 mm |
| Power transistor | 0.01-1 μm | 150 μm | 2-20 | 0.1-5 mm |

The dimensional data of the transistors used (for FETs) are largely dependent on the output power to be generated. For low-power logic circuits, here smaller transistors are also possible. The above-stated information relates essentially to applications of power amplifiers.

The following table shows an exemplary embodiment for parameters of the transistors of a combined amplifying cell used:

|  | Gate length | Pin - gate width | Number of pins | Total gate width |
|---|---|---|---|---|
| Basic transistor | 0.25 μm | 100 μm | 4 | 0.4 mm |
| Load transistor | 0.25 μm | 100 μm | 4 | 0.4 mm |
| Power transistor | 0.25 μm | 150 μm | 8 | 1.2 mm |

FIG. 3 shows in three details a) to c) scalable amplifier unit cells, namely in detail a) one amplifier unit cell, in detail b) two amplifier unit cells, in detail c) four amplifier unit cells.

FIG. 3a shows an amplifier unit cell analog to that shown in FIGS. 1 and 2. The input 1, output 2, basic transistor 3a, and load transistor 5a are indicated.

In FIG. 3b two amplifier unit cells are arranged mirror-symmetrically side-by-side, with the outputs 2.1, 2.2 being indicated. A first axis of symmetry S1 extends through the amplifier input 1 and though the center between the basic transistors 3.a, 3.b of the two amplifier unit cells. By the symmetric arrangement of at least two amplifier unit cells a space-saving integrated arrangement develops on the chip.

The amplifier circuit comprises a common first bias-line 6 for the two drain-contacts 5.a.3, 5.b.3 of the load transistors 5.a, 5.b. Similarly the amplifier circuit comprises a common second bias-line 7 for the two source contacts 3.a.3, 3.b.3 of the basic transistors 3.a, 3.b. The first bias line 6 and the second bias line 7 extend essentially parallel in reference to each other and perpendicular in reference to the axis of symmetry S1.

FIG. 3c shows four amplifier unit cells, arranged side-by-side and mirror-symmetrically. Here, respectively two amplifier unit cells are arranged side-by-side similar to FIG. 3b in a mirror-symmetric fashion. The first exterior axis of symmetry S1.1 extends through the amplifier input 1.1 and through the center between two basic transistors 3.a, 3.b of two amplifier unit cells arranged side-by-side and the two outputs 2.1, 2.1. The second exterior axis of symmetry S 1.2 extends through the amplifier input 1.2 and through the center between two basic transistors 3.c, 3.d of two amplifier unit cells arranged side-by-side and the two outputs 2.3, 2.4. A central axis of symmetry S2 extends perpendicular in reference to the load transistors through the center of the two exterior axes of symmetry S 1.1, S 1.2.

The four amplifier unit cells arranged side-by-side comprise, similar to FIG. 3b, the common first bias-line 6 for the drain contacts 5.a.3, 5.b.3, 5.c.3, 5.d.3 of the load transistors 5.a, 5.b, 5.c, 5.d. Similarly the amplifier circuit comprises a common second bias line 7 for the source contacts 3.a.3, 3.b.3, 3.c.3, 3.d.3 of the basic transistors 3.a, 3.b, 3.c, 3.d. The first bias line 6 and the second bias line 7 extend essentially parallel in reference to each other and perpendicular in reference to the axis of symmetry S 1.1, S 1.2, S 2.

Figure 4:
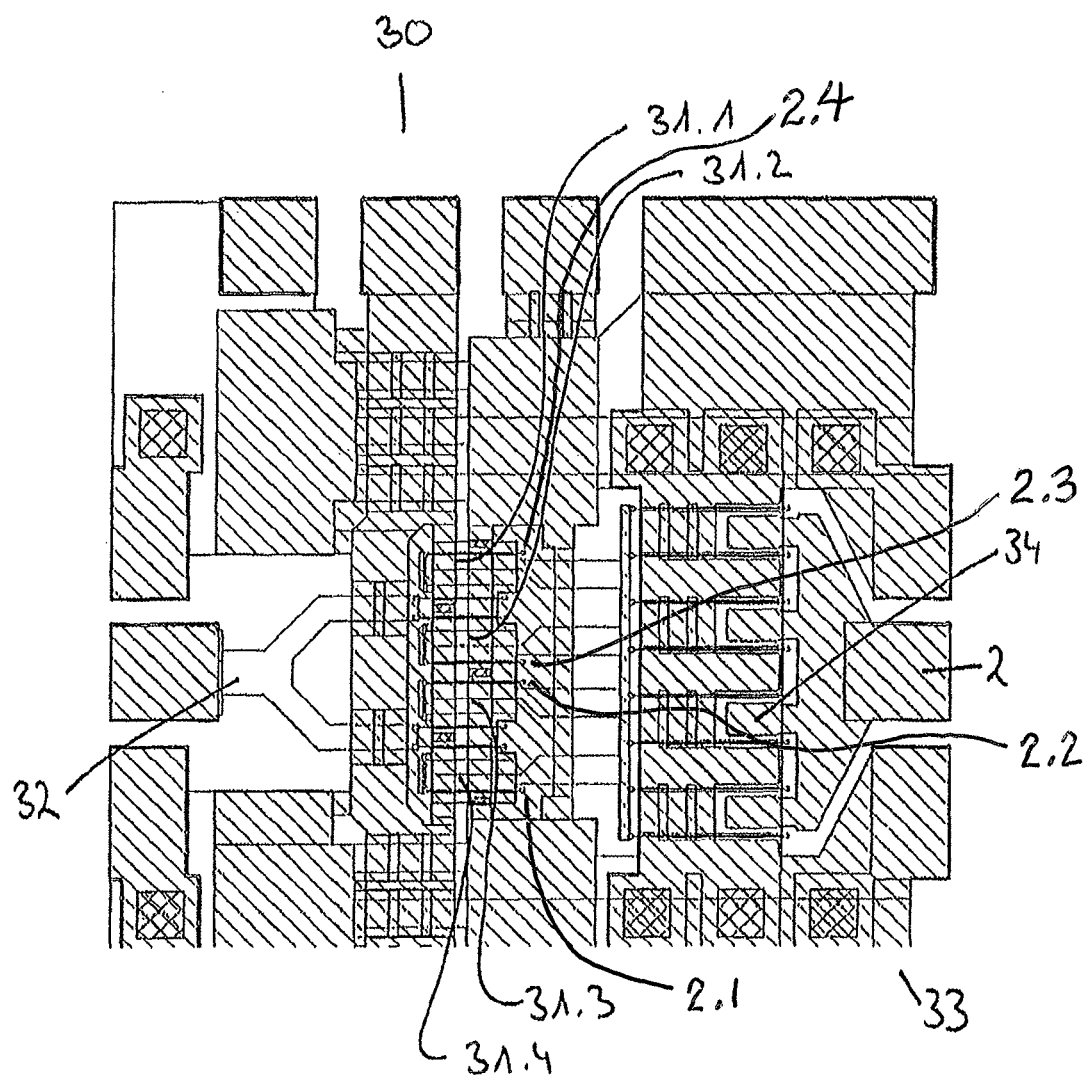
FIG. 4 is a second exemplary embodiment of an amplifier layout of the amplifier circuit according to the invention with a power transistor.

FIG. 4 shows an amplifier circuit in a switch-mode power amplifier as another exemplary embodiment of the amplifier circuit according to the invention. The amplifier circuit comprises a driver stage 30 and a power transistor stage 33.

The driver stage 30 comprises four amplifier unit cells, switched parallel, 31.1, 31.2, 31.3, 31.4. The amplifier unit cells 31.1, 31.2, 31.3, 31.4 have a common amplifier input 32, which is equivalent to the amplifier input 1 of the amplifying circuit. Each amplifier unit cell is connected with its cell output 2.1, 2.2, 2.3, 2.4 to the power transistor stage 33. The power transistor stage comprises a power transistor 34. Thus in the present case four amplifier unit cells 31.1, 31.2, 31.3, 31.4 are switched parallel and form the driver stage for the power transistor 34.

The amplifier circuit is embodied as an integrated circuit on a semiconductor chip. This way, the parasitic effects are reduced between the driver stage and the power transistor.

FIG. 5 shows exemplary circuits for driver stages with different impedance elements. The use of diodes is shown as an example. One diode may also be replaced by several (preferably by two to ten) diodes switched serially.

Figure 5A:
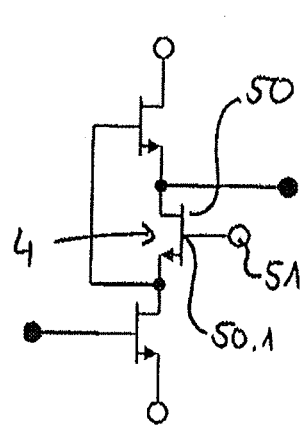
FIGS. 5a, 5b, 5c, 5d, 5e, 5f, 5g, 5h, 5i, & 5j show an exemplary circuit for various impedance elements.
Figure 5B:
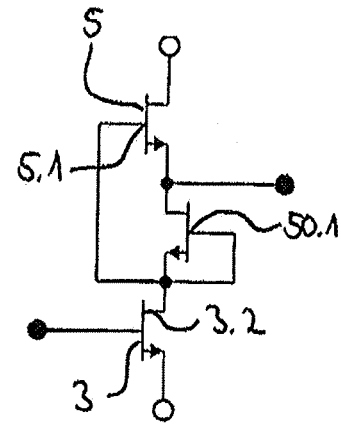
Figure 5C:
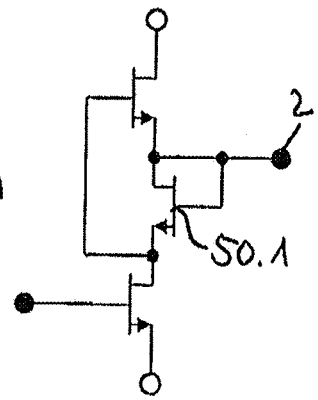
Figure 5E:
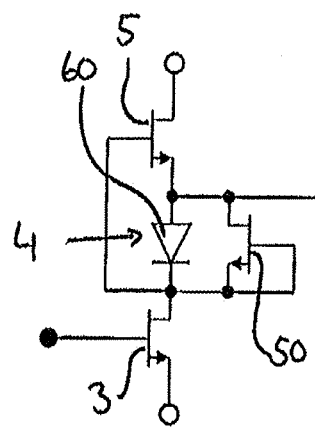
Figure 5F:
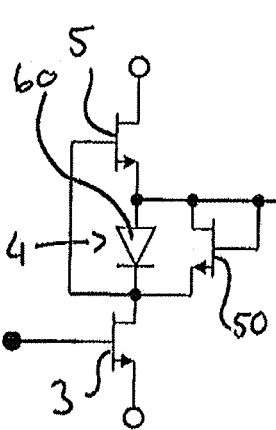
Figure 5D:
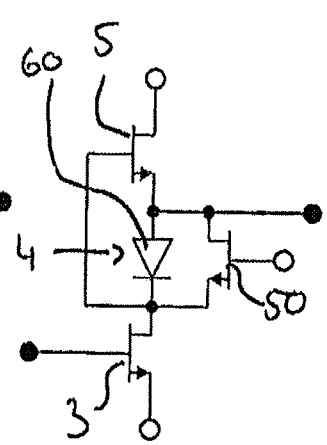

The details a, b, and c show amplifier circuits, in which the impedance element 4 is embodied as a transistor 50. In FIG. 5a the gate 50.1 of the transistor 50 is connected to an external potential 51. In FIG. 5b the gate 50.1 of the transistor 50 is connected to the drain contact 3.2 of the basic transistor 3 and thus also to the gate contact 5.1 of the load transistor 5. In FIG. 5c the gate 50.1 of the transistor 50 is connected to the cell output 2.

Amplifier circuits are shown in the details d, e, and f, in which the impedance element 4 is embodied as a combination of a transistor 50 and a diode 60. The anode of the diode 60 is respectively connected to the load transistor 5. The cathode of the diode 60 is respectively connected to the basic transistor 3. The circuit of the transistor 50 in FIG. 5d occurs similar to FIG. 5a. The circuit of the transistor 50 in FIG. 5e occurs similar to FIG. 5b, and the circuit of the transistor 50 in FIG. 5f occurs similar to FIG. 5c.

Figure 5J:
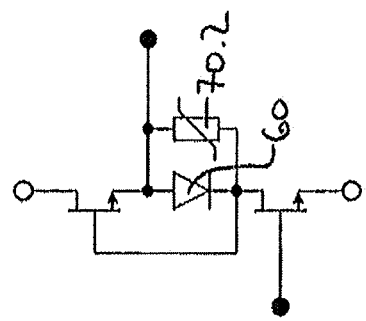
Figure 5I:
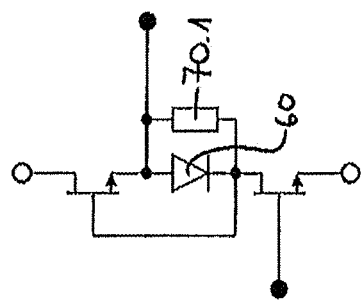
Figure 5H:
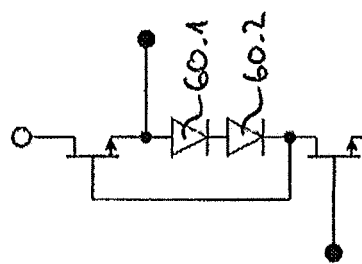
Figure 5G:
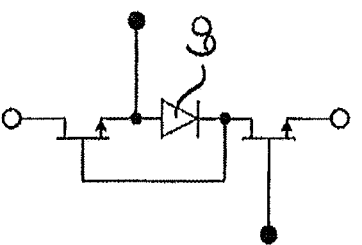

The details in FIG. 5g and FIG. 5h show amplifier circuits, in which the impedance element 4 is embodied as a diode 60 or as a combination of two diodes 60.1 and 60.2. In FIG. 5g the anode of the diode 60 is connected to the load transistor 5. The cathode of the diode 60 is connected to the basic transistor 3. In FIG. 5h the impedance element 4 is embodied as a serial circuit comprising two diodes 60.1 and 60.2.

Amplifier circuits are shown in the details FIGS. 5i and 5j, in which the impedance element 4 is embodied as a combination of a diode 60 and a resistance 70.1, 70.2. In FIG. 5i the diode 60 and the resistor 70.1 are switched parallel. The resistance 70.1 is embodied as a linear ohmic resistor. In FIG. 5j the diode 60 and the resistance 70.2 are switched parallel. The resistance 70.2 is embodied as a non-linear resistance with saturation features at a saturation voltage that can be predetermined.

Figure 6A:
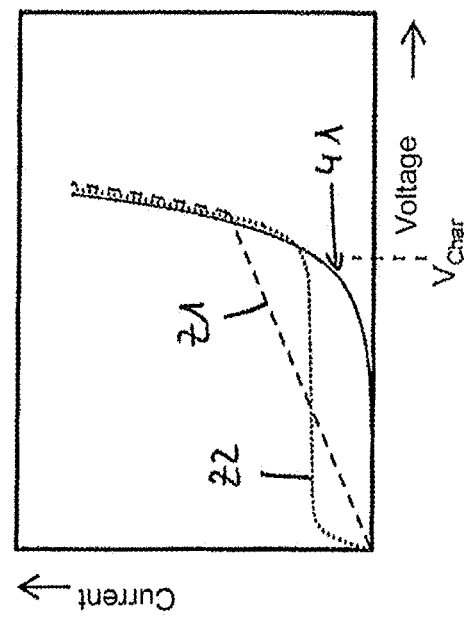
FIGS. 6a and 6b are a comparison illustration of the power-voltage characteristics of various exemplary embodiments.

FIG. 6a shows a comparing illustration of a power-voltage characteristic of an ohmic resistance 40, a diode 41, as well as a field effect transistor 42.

Figure 6B:
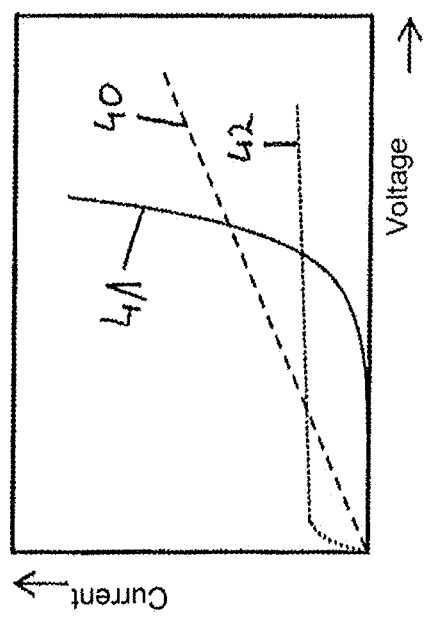

FIG. 6b shows a comparing illustration of the power-voltage characteristic of two different impedance elements Z1 (dashed line) and Z2 (dotted line).

The impedance element Z1 is embodied as a combination of one (or more) diodes with an ohmic resistance, as described regarding FIG. 5.1. At low voltages below the characteristic voltage $V_{char}$ the resistance dominates the behavior of the impedance element Z1. The impedance element Z1 shows a high differential resistance. Above the characteristic voltage $V_{char}$ the diode dominates the behavior of the impedance element Z1. By minor changes of the voltage, here a comparatively large change of the current occurs. The impedance element Z1 has a low differential resistance.

The impedance element Z2 is embodied as a combination of a diode with a field effect transistor, as described regarding FIGS. 5 d, e, and f. At low voltages below a characteristic voltage $V_{char}$ the field effect transistor dominates the behavior of the impedance element Z2. The impedance element Z2 shows here a high differential resistance, however at a current flux that can be predetermined. Above the characteristic voltage $V_{char}$ the diode dominates the behavior of the impedance element Z2. By minor changes at the voltage a comparatively large change of the current develops. The Impedance element Z2 shows a low differential resistance.

The invention claimed is:

1. An amplifier circuit, comprising
   at least two amplifier unit cells, each of the two amplifier unit cells comprises:
   a basic transistor (3), a load transistor (5), and an impedance element (4), with the basic transistor (3) being connected to the impedance element (4) and the load transistor (5);
   the basic transistor (3) and the load transistor (5) are embodied as non-complementary single-pin transistors;

the basic transistor (3) and the load transistor (5) are embodied and arranged cooperating with the impedance element (4);

a cell input and a cell output, with the cell input being connected to the gate contact (3.1) of the basic transistor (3) and the cell output being connected to a contact of the impedance element (4), and an amplifier input (1) and an amplifier output (2), said amplifier input (1) being connected to the cell inputs of the at least two amplifier unit cells, and the amplifier output (2) being connected to the cell outputs of the at least two amplifier unit cells, and the two amplifier unit cells are arranged on a common semiconductor substrate.

2. The amplifier circuit according to claim 1, wherein the at least two amplifier unit cells are arranged positioned side-by-side, with an amplifier unit cell input of one of the amplifier unit cells being connected to an amplifier unit cell input of the other of the amplifier unit cells or an amplifier unit cell output of one of the amplifier unit cells being connected to an amplifier unit cell output of the other of the amplifier unit cells.

3. The amplifier circuit according to claim 1, wherein the two amplifier unit cells are arranged as a symmetric pair with the two amplifier unit cells being arranged mirror-symmetrically, with at least the basic transistors (3), the load transistors (5), and the impedance elements (4) arranged mirror-symmetrically with regards to a first axis of symmetry (S1) extending between the basic transistors (3) or between the load transistors (5).

4. The amplifier circuit according to claim 3, wherein the basic transistors (3) or the load transistors (5) about the first axis of symmetry (S1) are arranged next to each other, with the basic transistors (3) or the load transistors (5) arranged directly abutting the first axis of symmetry (S1).

5. The amplifier circuit according to claim 3, wherein at least two symmetric pairs of the amplifier unit cells are arranged side-by-side.

6. The amplifier circuit according to claim 5, wherein the at least two symmetric pairs of the amplifier unit cells are arranged in a mirror-symmetric fashion about a second axis of symmetry (S2) extending between the at least two symmetric pairs of amplifier unit cells.

7. The amplifier circuit according to claim 1, wherein the amplifier circuit comprises a common first bias line (6) for all drain contacts of the load transistors (5) and a common second bias line (7) for all source contacts of the basic transistors (3).

8. The amplifier circuit according to claim 7, wherein the first bias line (6) and the second bias line (7) extend essentially parallel.

9. The amplifier circuit according to claim 7, wherein the drain contact of the basic transistor (3) is connected to the gate contact (3.1) of the load transistor (5) and the impedance element (4) and the source contact (5.2) of the load transistor (5) is connected to the impedance element (4) and the cell output.

10. The amplifier circuit according to claim 1, wherein the basic transistor (3) is embodied as d-mode (reduction) or e-mode (enriching) field effect transistor and the load transistor (5) is embodied as a d-mode (reduction) field effect transistor.

11. The amplifier circuit according to claim 1, wherein the impedance element (4) is capacitive and comprises a parasitic capacitance which is lower than a gate capacitance of the load transistor (5) and the basic transistor (3).

12. The amplifier circuit according to claim 1, wherein the impedance element (4) comprises a diode.

13. The amplifier circuit according to claim 12, wherein the impedance element comprises a diode and a field effect transistor.

14. The amplifier circuit according to claim 1, wherein the impedance element (4) comprises a non-linear current-voltage characteristic.

15. The amplifier circuit according to claim 1, wherein the impedance element (4) comprises a first high differential resistance below a characteristic voltage and a second low differential resistance above the characteristic voltage.

16. The amplifier circuit according to claim 15, wherein a defined current flux is adjustable below the characteristic voltage while maintaining the first high differential resistance.

17. The amplifier circuit according to claim 1, further comprising at least one power transistor (34), said power transistor (34) being arranged between the amplifier unit cells (31) and the amplifier output (2) and being connected to at least one cell output.

18. The amplifier circuit according to claim 17, wherein the amplifier unit cells (31) and at least one power transistor (34) are arranged on one chip or a common semiconductor substrate.

19. The amplifier circuit according to claim 18, wherein each of the amplifier unit cells (31) is connected with a cell output to at least one power transistor (34).

20. The amplifier circuit according to claim 18, wherein there are at least two of the amplifier circuits.

* * * * *